United States Patent [19]

Rokugo et al.

[11] Patent Number: 4,803,680
[45] Date of Patent: Feb. 7, 1989

[54] DESTUFFING CIRCUIT WITH A DIGITAL PHASE-LOCKED LOOP

[75] Inventors: Yoshinori Rokugo; Botaro Hirosaki, both of Tokyo, Japan

[73] Assignee: NEC Corporation, Tokyo, Japan

[21] Appl. No.: 947,240

[22] Filed: Dec. 29, 1986

[30] Foreign Application Priority Data

Dec. 27, 1985 [JP] Japan .................. 60-293247
May 15, 1986 [JP] Japan .................. 61-109572

[51] Int. Cl.$^4$ ............................. H04J 3/07
[52] U.S. Cl. ....................... 370/102; 375/120
[58] Field of Search ........... 370/102; 375/112, 118, 375/119, 120

[56] References Cited

U.S. PATENT DOCUMENTS

| | | | |
|---|---|---|---|
| 3,663,760 | 5/1972 | De Witt | 370/102 |
| 3,781,695 | 12/1973 | Jackson | |
| 4,010,323 | 3/1977 | Peck | 375/119 |
| 4,101,739 | 7/1978 | Mueller | 370/102 |
| 4,143,328 | 3/1979 | Kurita et al. | 375/120 |
| 4,280,099 | 7/1981 | Rattlingourd | 375/119 |
| 4,397,017 | 8/1983 | Rokugo | 370/102 |

OTHER PUBLICATIONS

R. W. Furtney, Jr., "Digital Phase-Locked Loop", IBM Technical Disclosure Bulletin, vol. 17, No. 7, Dec. 1974, pp. 1884–1886.
J. S. Mayo, "Experimental 224 Mb/s PCM Terminals", The Bell System Technical Journal, vol. XLIV, No. 9 (Nov. 1965), pp. 1813–1841.
Hirokazu Goto, "A Digital Phase-Locked Loop for Synchronizing Digital Networks", International Conference Communication (San Francisco, California, Jun. 8–10, 1978), pp. 34–21 to 34–25.

Primary Examiner—Douglas W. Olms
Assistant Examiner—Melvin Marcelo
Attorney, Agent, or Firm—Foley & Lardner, Schwartz, Jeffery, Schwaab, Mack, Blumenthal & Evans

[57] ABSTRACT

In a destuffing circuit for use in processing an input pulse sequence comprising data pulses, stuffing pulses, and control pulses into an output pulse sequence with reference to a data pulse timing signal, the output pulse sequence is produced with the stuffing and the control pulses removed from the input pulse sequence. A local signal producing arrangement produces a local signal by digital processing a predetermined one of first through M-th timing sequences derived from the data pulse timing signal and a preselected one of first through M-th local sequences derived from the local signal, where M represents a predetermined number. The destuffing circuit further comprises a destuffing arrangment responsive to the input sequence and produces the output pulse sequence by using the data pulse timing signal and the local signal.

6 Claims, 6 Drawing Sheets

DESTUFFING CIRCUIT WITH A DIGITAL PHASE-LOCKED LOOP

BACKGROUND OF THE INVENTION:

This invention relates to a destuffing circuit and, in particular, to a destuffing circuit for use in combination with a demultiplexer of a digital multiplexing system.

The digital multiplexing system comprises transmitting equipment and receiving equipment. The transmitting equipment converts a plurality of low-speed pulse trains into a high-speed pulse stream. Each low-speed pulse train is delivered from a low-speed transmission line and comprises input data pulses. The transmitting equipment comprises a plurality of stuffing circuits. Each stuffing circuit adds stuffing pulses to the input data pulses to form a stuffed pulse train. The stuffed pulse train comprises stuffing pulses and input data pulses. Such stuffed pulse trains are multiplexed into a multiplexed pulse train by a multiplexer. The multiplexed pulse train includes control pulses which comprise frame synchronization pulses, stuffing appointment pulses, and so on. The multiplexed pulse train may be scrambled into a scrambled pulse train by a scrambler. Either the multiplexed pulse train or the scrambled pulse train is produced as the high-speed pulse stream. The high-speed pulse stream is delivered to the receiving equipment through a high-speed transmission line.

The receiving equipment converts the high-speed pulse stream into a plurality of reproduced low-speed pulse trains. More specifically, the receiving equipment may comprise a descrambler which descrambles the high-speed pulse stream into a descrambled pulse train if the high-speed pulse stream is the scrambled pulse train. The descrambled pulse train corresponds to the multiplexed pulse train. The multiplexed pulse train is demultiplexed into a plurality of demultiplexed pulse trains by a demultiplexer. Each demultiplexed pulse train comprises the stuffed pulse train and the control pulses. The demultiplexed pulse train is supplied to a destuffing circuit as an input pulse sequence. The demultiplexer comprises a destuffing control circuit which produces a data pulse timing signal. The data pulse timing signal supplied to the destuffing circuit in addition to the input pulse sequence. The destuffing circuit produces an output pulse sequence in which the stuffing and the control pulses are removed.

One of the digital multiplexing systems is the M13 digital multiplexing system as it is called in the art. The M13 digital multiplexing system converts 28 low-speed pulse trains of 1.544 Mbit/s into a high-speed pulse stream of 44.736 Mbit/s.

A known destuffing circuit is described in an article contributed by J. S. Mayo to The Bell System Technical Journal, Volume XLIV, No. 9 (November 1965), pages 1813 to 1841, under the title of "Experimental 224 Mb/s PCM Terminals." The destuffing circuit comprises a local signal producing arrangement responsive to the data pulse timing signal for producing a local signal and a destuffing arrangement responsive to the input pulse sequence for producing the output pulse sequence by using first through M-th timing sequence derived from the data pulse timing signal and first through M-th local sequence derived from the local signal where M represents a first predetermined number. The local signal producing arrangement is for analog processing a predetermined one of the first through the M-th timing sequences and a preselected one of the first through the M-th local sequences into the local signal, namely, is an analog phase-locked loop (PLL). The analogue PLL comprises a voltage-controlled crystal oscillator and a low-pass filter which comprises an analog amplifier and an analog filter. It is difficult to manufacture such a destuffing circuit as an integrated circuit. Accordingly, the destuffing circuit is high-priced and large-sized and has a higher consumption rate of electric power. The analog PLL has a driving power supply for driving the analog PLL. The driving power supply comprises two power sources which comprise a plus and a minus power source. Accordingly, the destuffing circuit has a number of parts.

Various digital PLL's are already known. By way of example, a digital PLL is described in an article which is published by Hirokazu Goto on International Conference Communication (San Francisco, Calif., June 8–10, 1978) and which is entitled "A DIGITAL PHASE-LOCKED LOOP FOR SYNCHRONIZING DIGITAL NETWORKS."

Another digital PLL is disclosed in U.S. Pat. No. 3,781,695 issued to Edward J. Jackson. It is difficult in the known destuffing circuit to substitute either a conventional digital PLL of Goto or that of Jackson for the analog PLL. This is because such a destuffing circuit falls out of synchronization when pulses of the data pulse timing signal are quiescent during presence of the stuffing and the control pulses in the input pulse sequence and introduces a quantization jitter in excess of the permissible jitter standard of the digital multiplexing system.

SUMMARY OF THE INVENTION

It is therefore an object of this invention to provide a destuffing circuit which can comprise a digital PLL.

It is another object of this invention to provide a destuffing circuit of the type described, which does not fall out of synchronization.

It is still another object of this invention to provide a destuffing circuit of the type described for use in a digital multiplexing system, which makes the digital multiplexing system possible to satisfy the permissible jitter standard.

A destuffing circuit to which this invention is applicable, is responsive to an input pulse sequence comprising data pulses, stuffing pulses, and control pulses, and to a data pulse timing signal, for producing an output pulse sequence in which the stuffing and the control pulses are removed. The destuffing circuit comprises local signal producing means responsive to the data pulse timing signal for producing a local signal and destuffing means responsive to the input pulse sequence for producing the output pulse sequence by using first through M-th timing sequences derived from the data pulse timing signal and first through M-th local sequence derived from the local signal where M represents a predetermined number. According to this invention, the local signal producing means is for digital processing a predetermined one of the first through the M-th timing sequences and a preselected one of the first through the M-th local sequences into the local signal.

Figure 1:
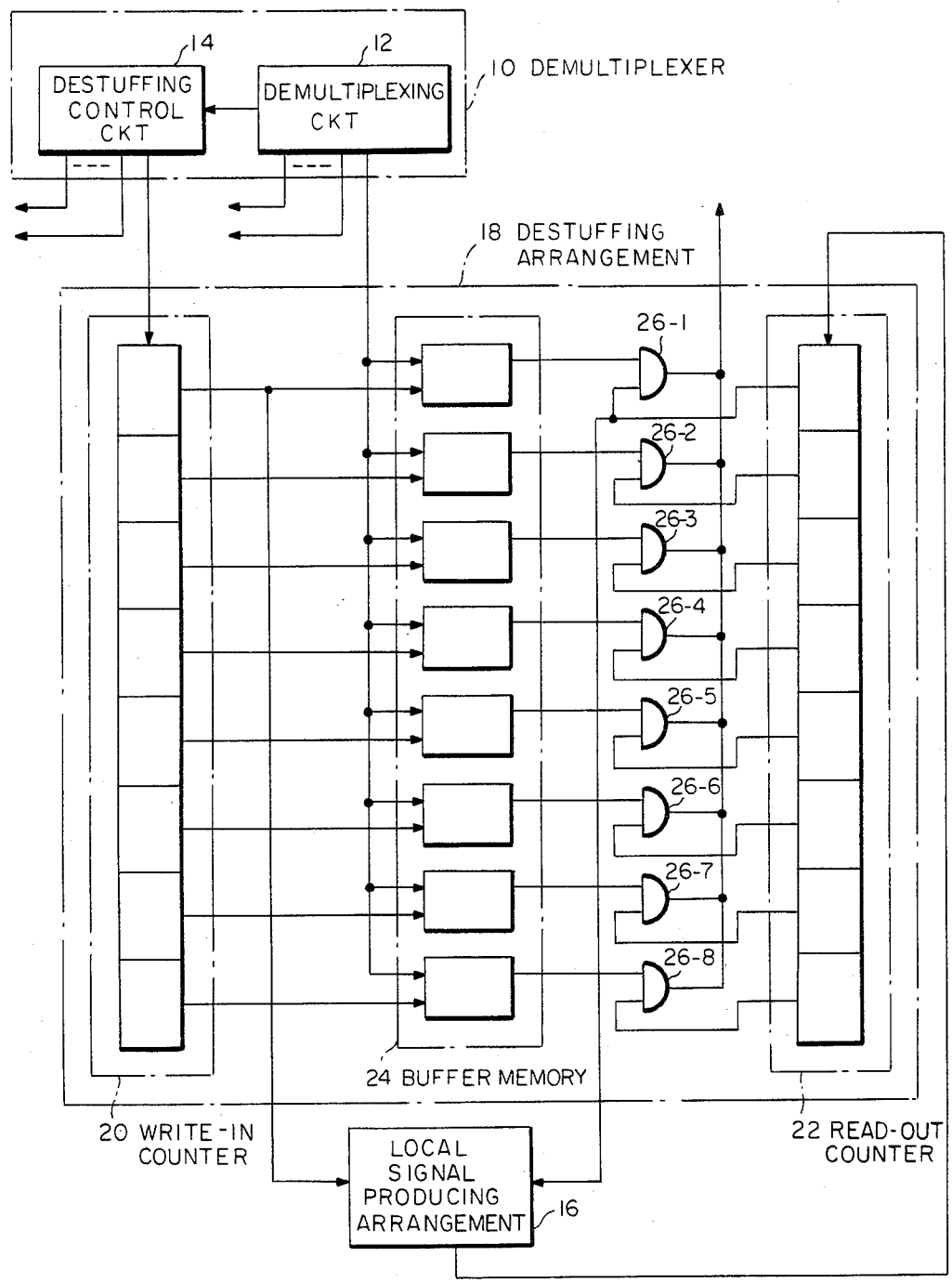
FIG. 1 shows, in blocks and together with a demultiplexer, a destuffing circuit according to an embodiment of the instant invention.

DESCRIPTION OF THE PREFERRED EMBODIMENT:

Referring to FIG. 1, a destuffing circuit according to an embodiment of this invention is for use in combination with a demultiplexer 10 and comprises a digital PLL (phase-locked loop).

The illustrated destuffing circuit is coupled to the demultiplexer 10 which comprises a demultiplexing circuit 12 and a destuffing control circuit 14. The demultiplexing circuit 12 produces a plurality of demultiplexed pulse trains, each of which comprises a stuffed pulse train and control pulses. The stuffed pulse train comprises input data pulses and stuffing pulses. The destuffing control circuit 14 produces a plurality of data pulse timing signals each of which comprises write-in clock pulses. The write-in clock pulses appear at a write-in clock interval in synchronism with the input data pulses. The write-in clock pulses are quiescent during presence of the stuffing pulses and the control pulses in the demultiplexed pulse train. The demultiplexed pulse trains are delivered to destuffing circuits as input pulse sequences, respectively. The data pulse timing signals are also delivered to the respective destuffing circuits.

Various jitter components are introduced into the input pulse sequence. For example, a jitter component appears in a low-speed transmission line. Another jitter component appears in a high-speed transmission line. In the destuffing circuit, time gaps appear as a result of removal of the stuffing and the control pulses. The destuffing circuit must remove the jitter components and the time gaps.

The destuffing circuit is for destuffing the input pulse sequence into an output pulse sequence with reference to the data pulse timing and a local signal. Generated in the manner which will later become clear, the local signal comprises read-out clock pulses. The read-out clock pulses appear at a read-out clock interval which is longer than the write-in clock interval. The output pulse sequence comprises output data pulses in synchronism with the read-out clock pulses.

The destuffing circuit comprises a local signal producing arrangement 16 and a destuffing arrangement 18. The local signal producing arrangement 16 produces the local signal in response to the data pulse timing signal. Responsive to the input pulse sequence, the destuffing arrangement 18 is for producing the output pulse sequence by using first through M-th timing sequences derived from the data pulse timing signal and first through M-th local sequences derived from the local signal where M represents a first predetermined number.

The destuffing arrangement 18 comprises a write-in counter 20. The write-in counter 20 is for dividing the data pulse timing signal into the first through the M-th timing sequences with each set of M write-in clock pulses distributed into the first through the M-th timing sequences. In the example being illustrated, the first predetermined number M is equal to eight. The write-in counter 20 is typically a ring counter which comprises eight flip-flops. The write-in counter 20 acts as a divide-by-M circuit which acts on the data pulse timing signal by a factor 1/M. The first through the M-th timing sequences have different phases.

A read-out counter 22 is for dividing the local signal into the first through the M-th local sequences with each set of M read-out clock pulses distributed into the first through the M-th local sequences. The read-out counter 22 is similarly a ring counter which comprises eight flip-flops. The read-out counter 22 acts as a divide-by-M circuit which acts on the local signal by a factor 1/M. The first through M-th local sequences have different phases.

Responsive to the first through the M-th or eighth timing sequences, a buffer memory 24 memorizes M or eight input data pulses as stored pulses. Responsive to the first through the M-th or eighth local clock sequence, the buffer memory 24 produces the stored pulses as M or eight output data pulses via first through eighth AND gates 26-1 through 26-8. The buffer memory 24 has a storage capacity of M bits which is determined in consideration of the above-mentioned jitter components and time gaps.

In the manner which will later be described more in detail, the local signal producing arrangement 16 is for digital processing a predetermined one of the first through the M-th or the eighth timing sequences and a preselected one of the first through the M-th or the eighth sequences into the local signal. In the illustrated example, the predetermined one of the first through the eighth timing sequences and the preselected one of the first through the eighth local sequences are the first timing sequence and the first local sequence, respectively.

Figure 2:
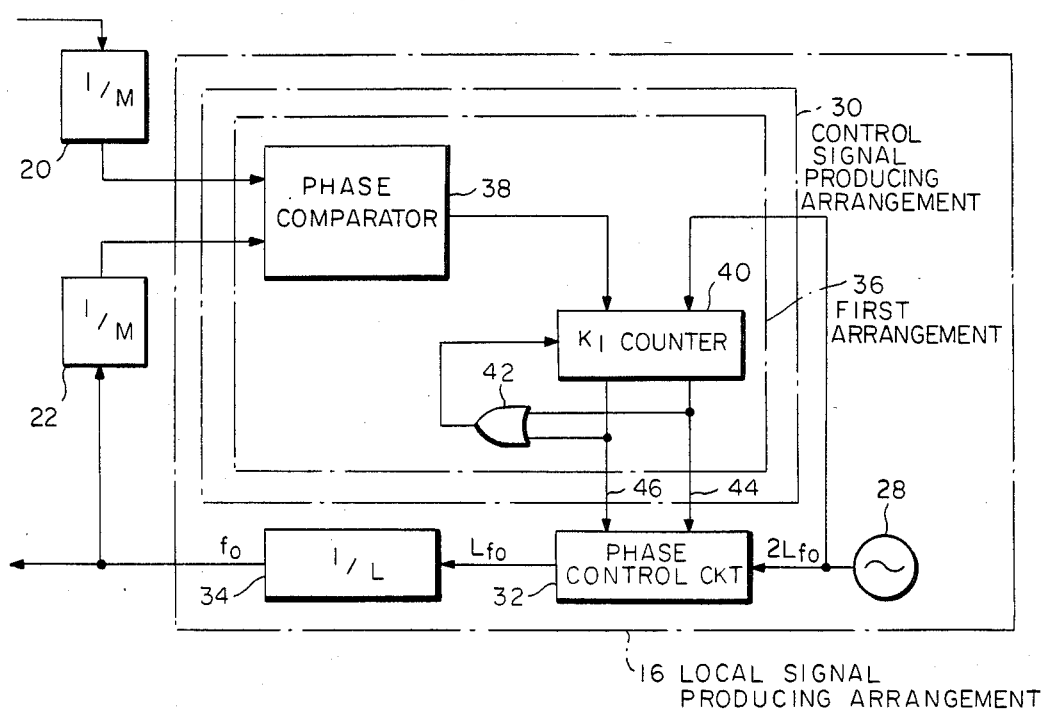
FIG. 2 is a block diagram of a first digital PLL for use in the destuffing circuit shown in FIG. 1.

Referring to FIG. 2, a first digital PLL comprises the write-in counter 20, the read-out counter 22, and the local signal producing arrangement 16. The local signal producing arrangement 16 comprises a main local clock oscillator 28.

The main local clock oscillator 28 generates a main local clock sequence having a controllable phase. The main local clock sequence comprises main local clock pulses which appear at a main local clock interval. The main local clock interval is shorter than the read-out clock interval. The main local clock sequence has a frequency of $2Lf_0$ where L represents a second predetermined number and $f_0$ represents a free run frequency of the local signal. The second predetermined number L must be greater than dozens in order to satisfy the permissible jitter standard.

Responsive to the first timing sequence and the first local sequence, a control signal producing arrangement 30 produces a control signal generated in the manner which will later become clear.

Responsive to the control signal, a phase control circuit 32 controls the controllable phase of the main local clock sequence in the manner which will later be described more in detail. The phase control circuit 32 produces a controlled clock sequence.

A divider 34 is representative of a divide-by-L circuit which is for frequency dividing the controlled clock sequence by a factor 1/L. The divider 34 produces the local signal.

The control signal producing arrangement 30 comprises a first arrangement 36. The first arrangement 36 comprises a phase comparator 38. The phase comparator 38 detects a phase difference between the first timing sequence and the first local sequence. The phase comparator 38 produces a phase difference signal indicating a selected first and second conditions which will later be described.

A first up/down counter 40 is herein named a $K_1$counter. The $K_1$ counter 40 is coupled to the main local clock oscillator 28 and has a first initial value of zero, a first upper threshold value of "$+K_1$", and a first lower threshold value of "$-K_1$." The first upper threshold value is higher than the first initial value. The first lower threshold value is lower than the first initial value. Responsive to the phase difference signal, the $K_1$ counter 40 counts up a first count in synchronism with the main local clock sequence when the phase difference signal indicates the first condition. Responsive to the phase difference signal, the $K_1$counter 40 counts down the first count in synchronism with the main local clock sequence when the phase difference signal indicates the second condition. The $K_1$ counter 40 produces a first addition instruction pulse whenever the first count increases up to the first upper threshold value $+K_1$. The $K_1$ counter 40 produces a first subtraction instruction pulse whenever the first count decreases down to the first lower threshold value $-K_1$.

An OR gate 42 acts as a first initializing arrangement for initializing the first count in the $K_1$counter 40 to zero whenever the $K_1$ counter 40 produces either the first addition instruction pulse or the first subtraction instruction pulse. Either of the first addition instruction pulse and the first subtraction instruction pulse is supplied to the phase control circuit 32 as the control signal through lines 44 and 46, respectively.

The phase control circuit 32 produces one of a normal and a modified clock sequence at a time as the controlled clock sequence. The normal clock sequence is produced when the first addition and the first subtraction instruction pulses are absent. The normal clock sequence has a clock period which is equal to twice the main local clock interval. Namely, the normal clock sequence has a frequency of $Lf_0$. The modified clock sequence is produced when one of the first addition and the first subtraction instruction pulses is present. The modified clock sequence is produced by adding a single pulse to the normal clock sequence each time when the first addition instruction pulse appears. When the first subtraction pulse appears, the modified clock sequence is produced by removing a single pulse from the normal clock sequence each time.

The first digital PLL shown in FIG. 2 is similar to the conventional digital PLL shown in U.S. Pat. No. 3,781,695 except that the data pulse timing signal and the local signal are supplied to the phase comparator 38 through the dividers 20 and 22, respectively. That is, in the conventional digital PLL of U.S. Pat. No. 3,781,695, the data pulse timing signal and the local signal are directly supplied to a phase comparator. Accordingly, the phase comparator 38 has in the first digital PLL an output characteristic which is M times expanded in comparison with an output characteristic of the phase comparator in the conventional digital PLL of U.S. Pat. No. 3,781,695.

Provided that the data pulse timing signal has an input phase of $\phi_{in}$ and that the local signal has an output phase of $\phi_{out}$, a phase transfer function $H_1(S)$ of the first digital PLL is:

$$H_1(S) = \frac{\Phi_{out}(S)}{\Phi_{in}(S)} = \frac{K}{S+K}, \qquad (1)$$

when S-transform is used where $K = f_0/K_1$ (rad/s). This is a first order loop. The phase transfer function $H_1(S)$ is kept untouched by addition of the dividers 20 and 22.

Figure 3:
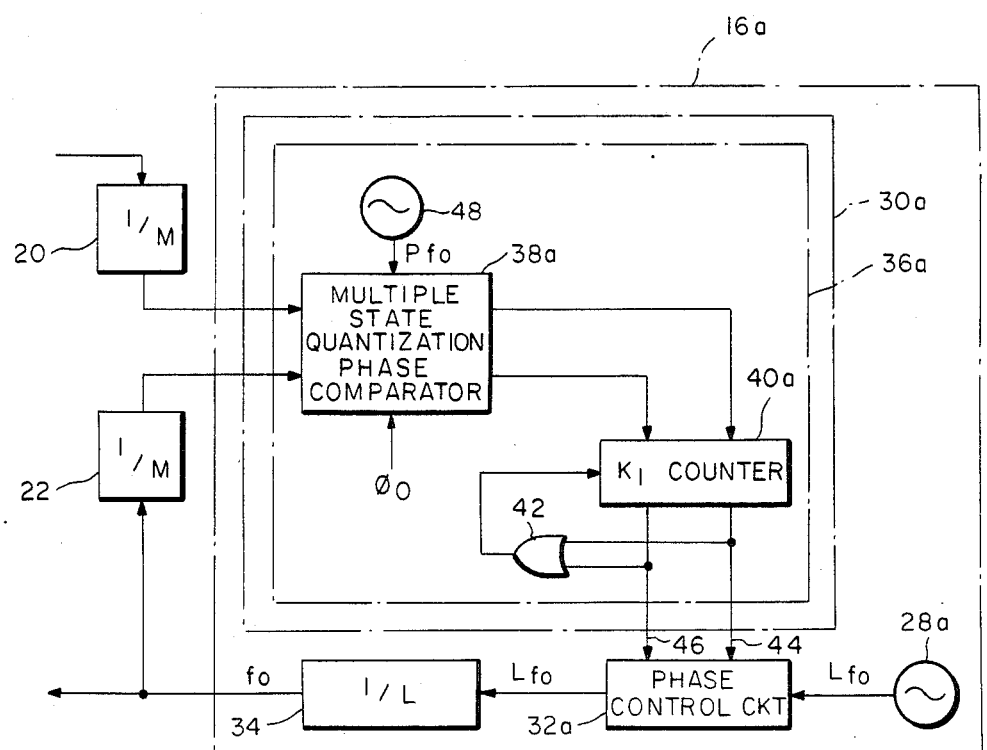
FIG. 3 is a block diagram of a second digital PLL for use in the destuffing circuit shown in FIG. 1.

Referring to FIG. 3, a second digital PLL is similar to that illustrated in FIG. 2 except that the local signal producing arrangement is modified from that illustrated in FIG. 2 as will later become clear. The local signal producing arrangement is therefore depicted at 16a.

The illustrated local signal producing arrangement 16a comprises a main local clock oscillator 28a which is similar to the main local clock oscillator 28 except that the main local clock sequence has a frequency of $Lf_0$.

The control signal producing arrangement is modified from that illustrated in FIG. 2 as will later become clear. The control signal producing circuit is therefore depicted at 30a. The control signal producing arrangement 30a comprises a first arrangement 36a which is similar to that illustrated in FIG. 2. More specifically, the first arrangement 36a comprises an additional local clock oscillator 48 for generating an additional local clock sequence which has a frequency of $Pf_0$ where P represents a third predetermined number and is not greater than the second predetermined number L.

A multiple state quantization phase comparator 38a is responsive to a predetermined phase difference $\phi_0$ and the additional local clock sequence. In the example being illustrated, the predetermined phase difference $\phi_0$ is equal to $\pi$(rad). The multiple state quantization phase comparator 38a detects a detected phase difference by subtracting a phase of the first local sequence from a phase of the first timing sequence. The multiple state quantization phase comparator 38a produces a lag indicating pulse when the detected phase difference is larger than the predetermined phase difference $\phi_0$ or $\pi$(rad). The multiple state quantization phase comparator 38a produces a lead indicating pulse when the detected phase difference is smaller than the predetermined phase difference $\phi_0$ or $\pi$(rad).

It should note that the detected phase difference is given by subtracting a phase of the local signal from a phase of the data pulse timing signal. A phase error is obtained by subtracting the predetermined phase difference from the detected phase difference.

Figure 4:
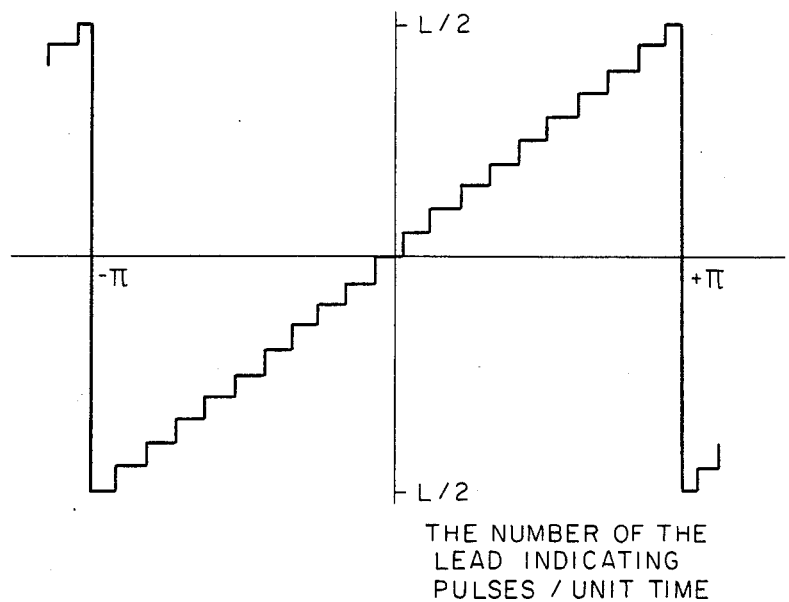
FIG. 4 shows an output characteristic of a phase comparator for use in a conventional digital PLL.
Figure 5:
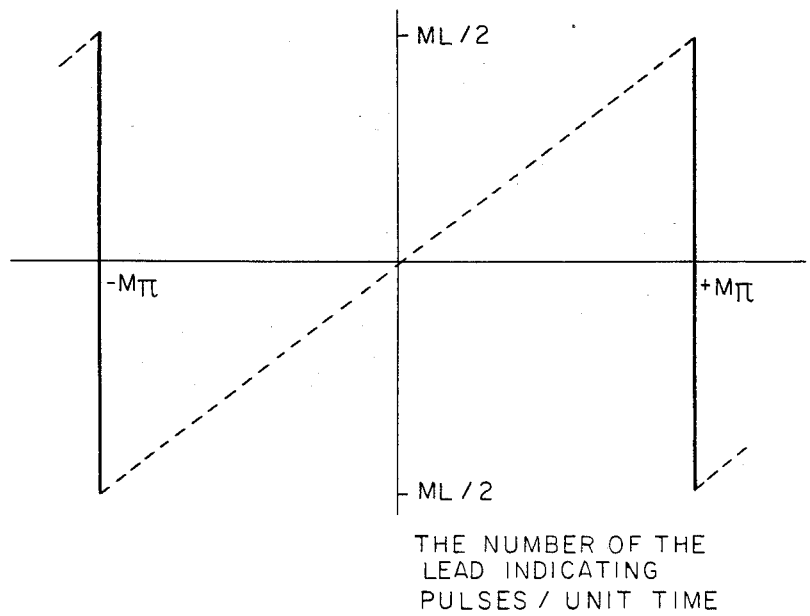
FIG. 5 shows an output characteristic of a phase comparator for use in the digital PLL shown in FIG. 3.

Referring to FIG. 4 and FIG. 5, the abscissa and the ordinate represent the phase error and the number of the lag or the lead indicating pulses/unit time. FIG. 4 shows an output characteristic of a phase comparator in the conventional digital PLL of U.S. Pat. No. 3,781,695. FIG. 5 shows an output characteristic of the multiple state quantization phase comparator 38a in the second digital PLL shown in FIG. 3. In the conventional digital PLL, the number of the indicating pulses/unit time is proportional to an absolute value of the phase error while the phase error is present between $-\pi$(rad) and $+\pi$(rad) as shown in FIG. 4. In the second digital PLL, the number of indicating pulses/unit time is proportional to the absolute value of the phase error while the phase error is present between $-M\pi$(rad) and $+M\pi$(rad). Accordingly, it is clear that the output characteristic of the multiple state quantization phase comparator 38a is M times expanded in comparison with the output characteristic of the phase comparator in the conventional digital PLL of U.S. Pat. No. 3,781,695.

A first up/down counter 40a is similar to that illustrated in FIG. 2 and is also herein named a $K_1$ counter. The $K_1$ counter 40a is coupled to the multiple state quantization phase comparator 38a. The $K_1$ counter 40a similarly has a first initial value of zero, a first, upper threshold value of "$+K_1$," and a first lower threshold value of "$-K_1$." The $K_1$ counter 40a counts up a first count in synchronism with the lag indicating pulse. The $K_1$ counter 40a counts down the first count in synchronism with the lead indicating pulse. The $K_1$ counter 40a produces a first addition instruction pulse whenever the first count increases up to the first upper threshold value $+K_1$. The $K_1$ counter 40a produces a first subtraction instruction pulse whenever the first count decreases down to the first lower threshold value $-K_1$.

An OR gate 42 similarly acts as a first initializing arrangement for initializing the first count in the $K_1$ counter 40a to zero whenever the $K_1$ counter 40a produces either the first addition instruction pulse or the first subtraction instruction pulse.

Each of the first addition instruction pulse and the first subtraction instruction pulse is supplied to a phase control circuit 32a as a control signal through lines 44 and 46, respectively.

Responsive to the control signal, the phase control circuit 32a controls the controllable phase of the main local clock sequence to produce a controlled clock sequence like the phase control circuit 32 illustrated in FIG. 2. More specifically, the phase control circuit 32a produces one of a normal and a modified clock sequence at a time as the controlled clock sequence. The normal clock sequence is produced when the first addition adn the first subtraction instruction pulses are absent. The normal clock sequence has a clock period which is equal to the main local clock interval. Namely, the normal clock sequence has a frequency of $Lf_0$. The modified clock sequence is produced when one of the first addition and the first subtraction instruction pulses is present. The modified clock sequence is produced by adding a single pulse to the normal clock sequence each time when the addition instruction pulse appears. When the first subtraction instruction pulse appears, the modified clock sequence is produced by removing a single pulse from the normal clock sequence each time.

A divider 34 is similar to that illustrated in FIG. 2 and is for frequency dividing the controlled clock sequence by a factor 1/L to produce the local signal. The second digital PLL is similar to the first digital PLL shown in FIG. 2 and is a first order loop.

Figure 6:
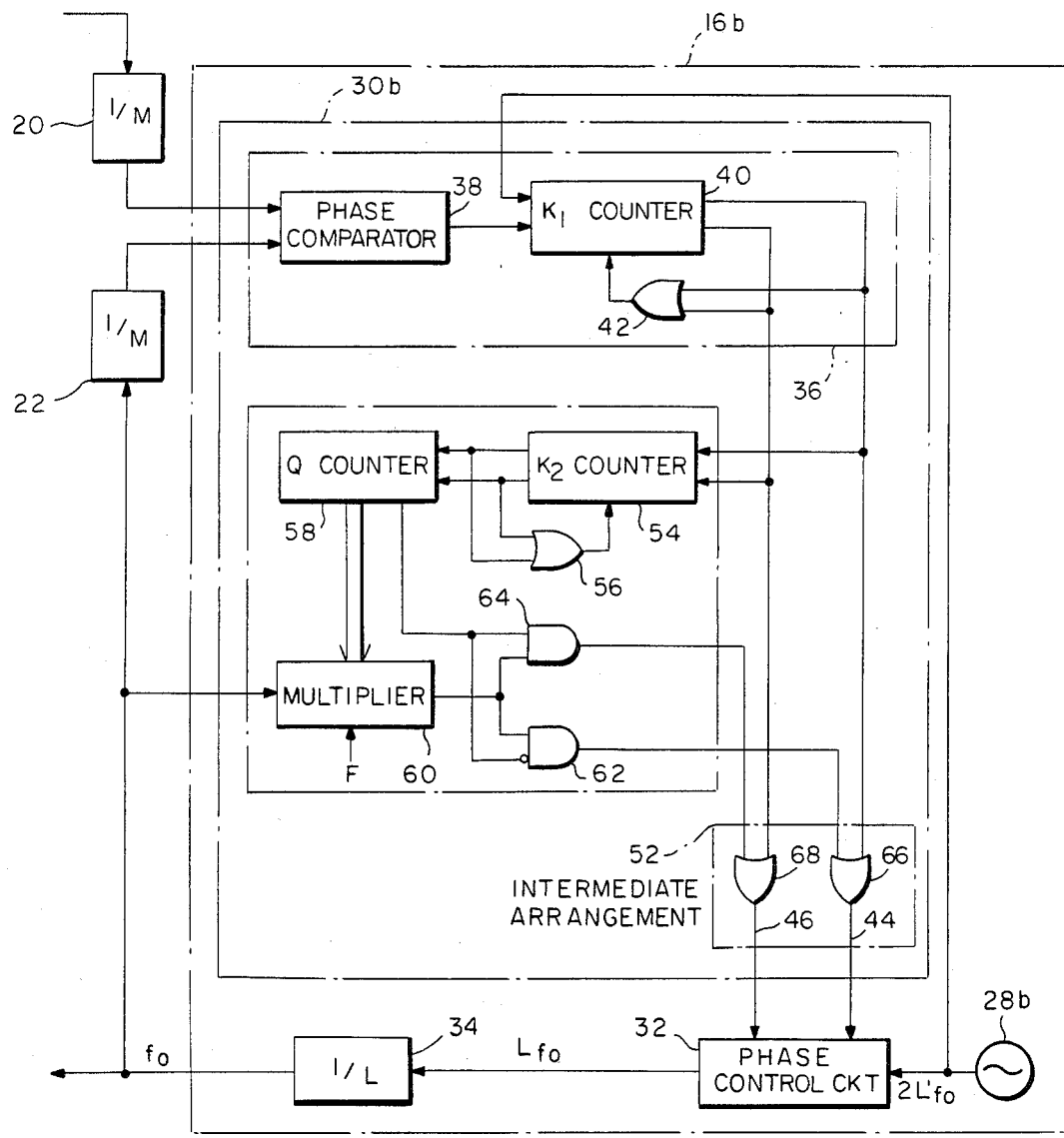
FIG. 6 is a block diagram of a third digital PLL for use in the destuffing circuit shown in FIG. 1.

Referring to FIG. 6, a third digital PLL is similar to that illustrated in FIG. 2 except that the local signal producing arrangement is modified from that illustrated in FIG. 2 as will later become clear. The local signal producing circuit is therefore depicted at 16b.

In the illustrated local signal producing arrangement 16b, similar parts are represented by like reference numerals as in FIG. 2. Description of such parts will be omitted for the purpose of brevity of the description. A main local clock oscillator 28b is similar to that illustrated in FIG. 2 and generates a main local clock sequence having a controllable phase. The main local clock sequence comprises main local clock pulses which appear at a main local clock interval. The main local clock interval is shorter than the read-out clock interval. The main local clock sequence has a frequency of $2L'f_0$ where $L'$ is approximately equal to the second predetermined number L and may not be an integer. Accordingly, the main local clock sequence may have a high-speed frequency, for example, of 44.736 Mb/s which is equal to that of the high-speed pulse stream in the M13 digital multiplexing system described heretobefore.

A control signal producing arrangement 30b is similar to that illustrated in FIG. 2 except that the control signal producing arrangement 30b further comprises a second arrangement 50 and an intermediate arrangement 52. Responsive to the local signal, the second arrangement 50 is for digital processing the first addition instruction pulse and the first subtraction instruction pulse to produce a second addition instruction pulse and a second subtraction instruction pulse. The intermediate arrangement 52 is coupled to the first and the second arrangements 36 and 50 to produce each of the first and the second addtion instruction pulses and the first and the second subtraction instruction pulses as the control signal.

The second arrangement 50 comprises a second up/down counter 54 which is coupled to the first arrangement 36. The second up/down counter 54 is herein named a $K_2$ counter. The $K_2$ counter 54 has a second initial value of zero, a second upper threshold value of "$+K_2$," and a second lower threshold value of "$-K_2$." The second upper threshold value is higher than the second initial value. The second lower threshold value is lower than the second initial value. The $K_2$ counter 54 counts up a second count in synchronism with the first addition instruction pulse. The $K_2$ counter 54 counts down the second count in synchronism with the first subtraction instruction pulse. The $K_2$ counter 54 produces a first renewal pulse whenever the second count increases up to the second upper threshold value $+K_2$. The $K_2$ counter 54 produces a second renewal pulse whenever the second count decreases down to the second lower threshold value $-K_2$.

An OR gate 56 acts as a second initializing arrangement for initializing the second count in the $K_2$ counter 54 to zero whenever the $K_2$ counter 54 produces either the first renewal pulse or the second renewal pulse.

A third up/down counter 58 is herein named a Q counter and is coupled to the $K_2$ counter 54. The Q counter 58 counts up a third count in synchronism with the first renewal pulse. The Q counter 58 counts down the third count in synchronism with the second renewal pulse. The third count has an absolute value represented by an absolute value signal. The third count selectively takes positive and negative signs which are produced as positive and negative sign signals, respectively. In the example being illustrated, the Q counter 8 produces a logical "1" level as the negative sign signal. The Q counter 58 produces a logical "0" level as the positive sign signal.

Responsive to the local signal and the absolute value signal, a multiplier 60 is for counting up the read-out clock pulses of the local signal to produce a distributed pulse signal. The distributed pulse signal comprises distributed pulses which are equal in number to the absolute value and which are equally distributed each time while the read-out clock pulses of the local signal and are counted to a preselected number. The distributed pulses appear at a distributed pulse interval.

An inhibit gate 62 and an AND gate 64 collectively act as a sign judging arrangement responsive to the distributed pulse signal and the sign signal for judging the sign represented by the sign signal. The inhibit gate 62 produces each pulse of the distributed pulse signal as the second addition instruction pulse when the sign signal indicates positive or the logical "0" level. The AND gate 64 produces each pulse of the distributed pulse signal as the second subtraction instruction pulse when the sign signal indicates negative or the logical "1" level.

The intermediate arrangement 52 comprises an OR gate 66 which acts as a first combining arrangement for combining the first addition instruction pulse with the second addition instruction pulse to produce a combined addition instruction pulse. Another OR gate 68 acts as a second combining arrangement for combining the first subtraction instruction pulse with the second subtraction instruction pulse to produce a combined subtraction instruction pulse. The combined addition instruction pulse and the combined subtraction instruction pulse are supplied to the phase control circuit 32 as the control signal through the lines 44 and 46, respectively.

The illustrated third digital PLL has a phase transfer function $H_2(S)$ which is:

$$H_2(S) = \frac{1 + 2\rho \frac{S}{\omega_n}}{1 + 2\rho \frac{S}{\omega_n} + \left(\frac{S}{\omega_n}\right)^2} \quad (2)$$

where $\omega_n$ and $\rho$ represent a natural frequency and a damping factor, respectively. This is a second order loop. Provided that the multiplexer 60 has the preselected number F, the natural frequency $\omega_n$ and the damping factor $\rho$ are given by:

$$\omega_n = f_0 / \sqrt{K_1 \cdot K_2 \cdot F} \quad \text{(rad/s)} \quad (3)$$

and $$\rho = \tfrac{1}{2} \sqrt{K_2 \cdot F / K_1} \quad . \quad (4)$$

Figure 7:
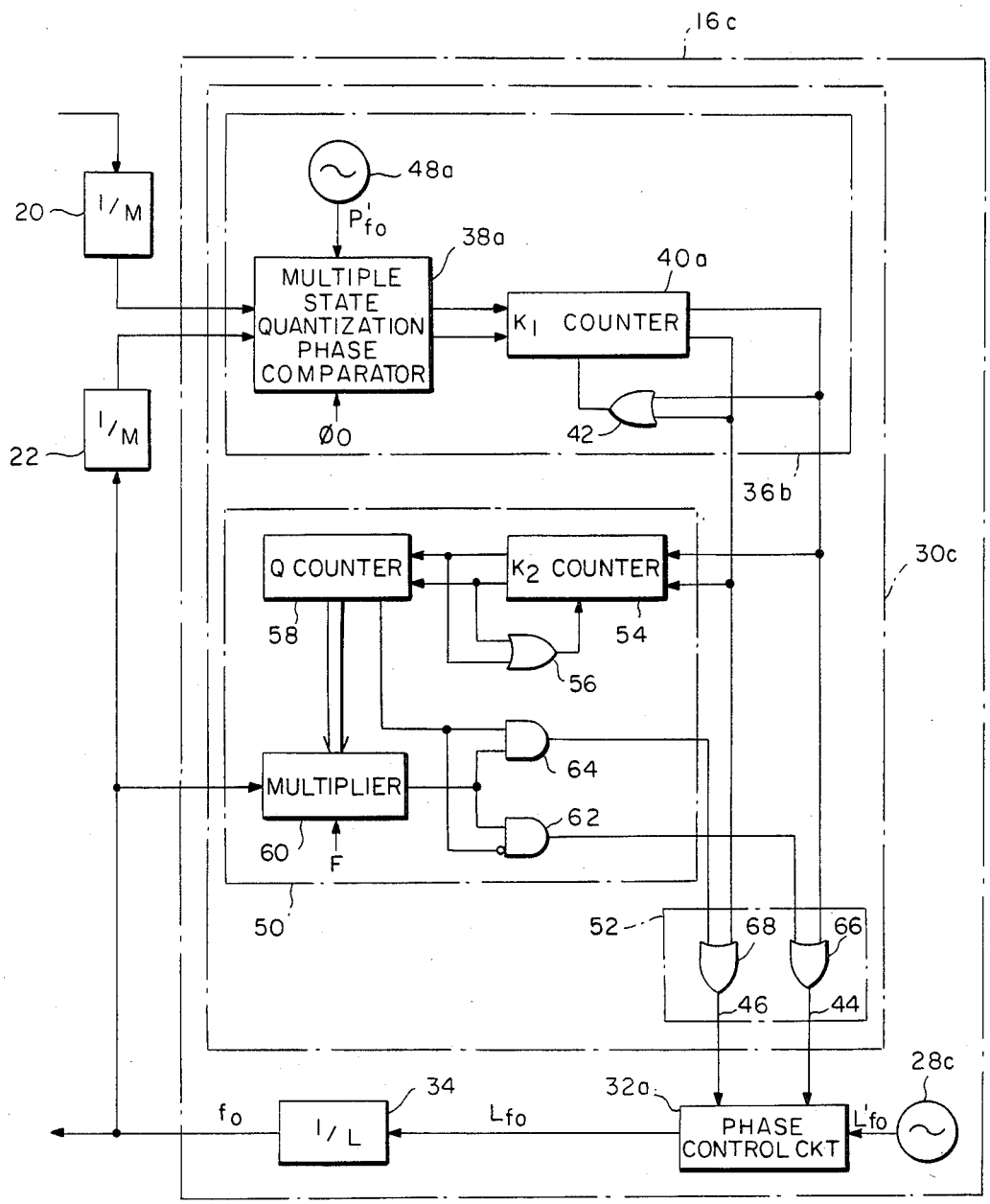
FIG. 7 is a block diagram of a fourth digital PLL for use in the destuffing circuit shown in FIG. 1.

Referring to FIG. 7, a fourth digital PLL is similar to that illustrated in FIG. 3 and FIG. 6 except that the local signal producing arrangement is modified from that illustrated in FIG. 3 and FIG. 6 as will later become clear. The local signal producing circuit is therefore depicted at 16c.

In the illustrated local signal producing arrangement 16c, similar parts are represented by like reference numerals as in FIGS. 3 and 6. Description of such parts will be omitted for the purpose of briefness of the description. A main local clock oscillator 28c is similar to that illustrated in FIG. 3 except that the main local clock oscillator 28c generates a main local clock sequence which has a frequency of $L'f_0$.

A control signal producing arrangement 30c is similar to that illustrated in FIG. 6 except that the first arrangement is modified from that illustrated in FIG. 6 as will later become clear. The first arrangement is therefore depicted at 36b.

The first arrangement 36b is similar to that illustrated in FIG. 3 except that an additional local clock oscillator 48a generates an additional local clock sequence which has a frequency of $P'f_0$ where $P'$ is approximately equal to the third predetermined number P and may not be an integer. The fourth digital PLL is similarly a second order loop.

In this connection, the third and the fourth digital PLLs are not quite satisfactory in that the quantization jitter increases due to a possibility such that the combined addition instruction pulse and the combined subtraction pulse may simultaneously occur. Such a disadvantage is inevitable in a digital PLL of a higher loop which is in excess of the second loop.

Figure 8:
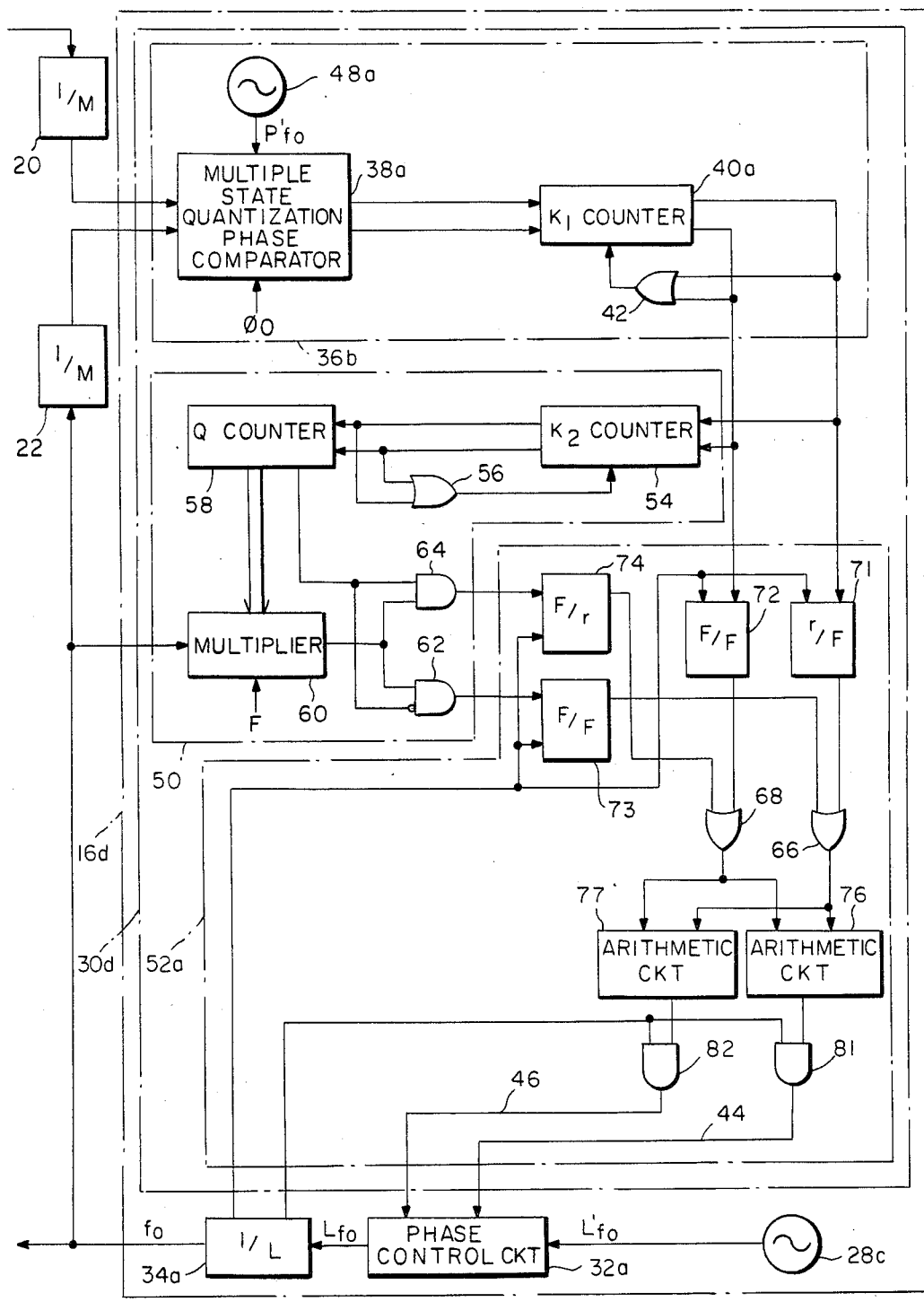
FIG. 8 is a block diagram of a fifth digital PLL for use in the destuffing circuit shown in FIG. 1.

Referring to FIG. 8, a fifth digital PLL is similar to that illustrated in FIG. 7 except that the local signal producing arrangement is modified from that illustrated in FIG. 7 as will later become clear. The local signal producing arrangement is therefore depicted at 16d.

In the illustrated local signal producing arrangement 16d, similar parts are represented by like reference numerals as in FIG. 7. Description of such parts will be omitted for the purpose of brevity of the description. A divider 34a is similar to that illustrated in FIG. 7 except that the divider 34a produces a timing pulse sequence and a reset pulse sequence in addition to the local signal. The timing pulse sequence comprises timing pulses which appear at a timing pulse interval. The reset pulse sequence comprises reset pulses which appear at a reset pulse interval. In the example being illustrated, both the timing pulse interval and the reset pulse interval are equal to the read-out clock interval. Both the timing pulse interval and the reset pulse interval may be equal to or shorter than the distributed pulse interval of the distributed pulses.

A control signal producing arrangement 30d is similar to that illustrated in FIG. 7 except that the intermediate arrangement is modified from that illustrated in FIG. 7 as will later become clear. The intermediate arrangement is therefore depicted at 52a.

The illustrated intermediate arrangement 52a comprises a first flip-flop (F/F) 71 which acts as a first temporary memory arrangement for temporarily memorizing the first addition instruction pulse as a first stored addition instruction pulse. The flip-flop 71 erases the first stored addition instruction pulse in synchronism with the reset pulse sequence when the first stored addition instruction pulse is present.

A second flip-flop 72 similarly acts as a second temporary memory arrangement for temporarily memorizing the first subtraction instruction pulse as a first stored subtraction instruction pulse. The second flip-flop 72 erases the first stored subtraction instruction pulse in synchronism with the reset pulse sequence when the first stored subtraction instruction pulse is present.

A third flip-flop 73 acts as a third temporary memory arrangement for temporarily memorizing the second, addition instruction pulse as a second stored addition instruction pulse. The third flip-flop 73 erases the second stored addition instruction pulse in synchronism with the reset pulse sequence when the second stored addition instruction pulse is present.

A fourth flip-flop 74 similarly acts as a fourth temporary memory arrangement for temporarily memorizing the second subtraction instruction pulse as a second stored subtraction instruction pulse. The fourth flip-flop 74 erases the second stored subtraction instruction pulse in synchronism with the reset pulse sequence when the second stored subtraction instruction pulse is present.

An OR gate 66 is similar to that illustrated in FIG. 7 and acts as a first combining arrangement for combining the first stored addition instruction pulse with the second stored addition instruction pulse to produce a combined addition instruction pulse. Another OR gate 68 is similar to that illustrated in FIG. 7 and acts as a second combining arrangement for combining the first stored subtraction instruction pulse with the second stored subtraction instruction pulse to produce a combined subtraction instruction pulse.

An arithmetic circuit 76 acts as a first additional arrangement for cancelling the combined addition instruction pulse by the combined subtraction instruction pulse. The arithmetic circuit 76 produces an uncancelled addition instruction pulse only when the combined addition instruction pulse alone is present. Otherwise, the arithmetic circuit 76 produces no pulse. Another arithmetic circuit 77 similarly acts as a second additional arrangement for cancelling the combined subtraction instruction pulse by the combined addition instruction pulse. The arithmetic circuit 77 produces an uncancelled subtraction instruction pulse only when the combined subtraction instruction pulse alone is present. Otherwise, the arithmetic circuit 77 produces no pulse.

An AND gate 81 acts as a first timing decision arrangement for deciding timing of generation of the uncancelled addition instruction pulse with reference to the timing pulse sequences. The AND gate 81 produces the uncancelled addition instruction pulse as a timed addition instruction pulse in synchronism with the timing pulse sequence when the uncancelled addition instruction pulse is present. Another AND gate 82 similarly acts as a second timing decision arrangement for deciding timing of generation of the uncancelled subtraction instruction pulse with reference to the timing pulse sequence. The AND gate 82 produces the uncancelled subtraction instruction pulse as a timed subtraction instruction pulse in synchronism with the timing pulse sequence when the uncancelled subtraction instruction pulse is present. Either of the timed addition instruction pulse and the timed subtraction instruction pulse is supplied to the phase control circuit 32a as the control signal through the lines 44 and 46, respectively. The fifth digital PLL is similarly a second order loop.

With this structure, it is possible to decrease the quantization jitter because concurrent appearance is avoided between the first addition instruction pulse and the second subtraction instruction pulse and between the first subtraction instruction pulse and the second addition instruction pulse. Such a structure may similarly be applicable to any digital PLL having a higher order loop.

While this invention has so far been described in conjunction with several embodiment thereof, it will readily be possible for those skilled in the art to put this invention into practice in other manners.

What is claimed is:

1. In a destuffing circuit responsive to an input pulse sequence comprising data pulses, stuffing pulses, and control pulses, and to a data pulse timing signal, for producing an output pulse sequence in which said stuffing and said control pulses are removed, said destuffing circuit comprising local signal producing means responsive to said data pulse timing signal for producing a local signal and destuffing means responsive to said input pulse sequence for producing said output pulse sequence by using first through M-th timing sequences derived from said data pulse timing signal and first through M-th local sequences derived from said local signal where M represents a predetermined number, said local signal producing means comprising:

main local clock generating means for generating a main local clock sequence having a controllable phase;

control signal producing means responsive to a predetermined one of said first through the M-th timing sequences and a preselected one of said first through the M-th local sequences for producing a control signal;

phase controlling means responsive to said control signal for controlling said controllable phase of the main local clock sequence to produce a controlled clock sequence; and divider means for frequency dividing said controlled clock sequence to produce said local signal;

said control signal producing means comprising:

first means for digital processing said predetermined one of the first through the M-th timing sequences and said preselected one of the first through the M-th local sequences to produce one of a first addition instruction pulse and a first subtraction instruction pulse at a time; and intermediate means coupled to said first means for producing each of said first addition instruction pulse and said first subtraction instruction pulse as said control signal;

said first means comprising:

additional local clock generating means for generating an additional local clock sequence which has a frequency not higher than that of said main local clock sequence;

multiple state quantization phase comparator means responsive to a predetermined phase difference and said additional local clock sequence for detecting a detected phase difference by subtracting a phase of said preselected one of the first through the M-th local sequences from a phase of said predetermined one of the first through the M-th timing sequences, said multiple state quantization phase comparator means producing a lag indicating pulse when said detected phase difference is larger than said predetermined phase difference, said multiple state quantization phase comparator means producing a lead indicating pulse when said detected phase difference is smaller than said predetermined phase difference;

first up/down counter means coupled to said multiple state quantization phase comparator and having a first initial value, a first upper threshold value, and a first lower threshold value, said first upper threshold value being higher than said first initial value, said first lower threshold value being lower than the first initial value, said first up/down counter means being responsive to said lag indicating pulse and said lead indicating pulse for counting up and down a first count in synchronism with said lag indicating pulse and said lead indicating pulse, respectively, said first up/down counter means producing said first addition instruction pulse whenever said first count increases up to said first upper threshold value, said first up/down counter means producing said first subtraction instruction pulse whenever said first count decreases down to said first lower threshold value; and first initializing means for initializing the first count in said first up/down counter means to said first initial value whenever said first up/down counter means produces one of said first addition instruction pulse and said first subtraction instruction pulse.

2. In a destuffing circuit responsive to an input pulse sequence comprising data pulses, stuffing pulses, and control pulses, and to a data pulse timing signal, for producing an output pulse sequence in which said stuffing and said control pulses are removed, said destuffing circuit comprising local signal producing means responsive to said data pulse timing signal for producing a local signal and destuffing means responsive to said input pulse sequence for producing said output pulse sequence by using first through M-th timing sequences derived from said data pulse timing signal and first through M-th local sequences derived from said local signal where M represents a predetermined number, said local signal producing means comprising:

main local clock generating means for generating a main local clock sequence having a controllable phase;

control signal producing means responsive to a predetermined one of said first through said M-th timing sequences and a preselected one of said first through said M-th local sequences for producing a control signal;

phase controlling means responsive to said control signal for controlling said controllable phase of the main local clock sequence to produce a controlled clock sequence; and divider means for frequency dividing said controlled clock sequence to produce said local signal;

said control signal producing means comprising:

first means for digital processing said predetermined one of the first through the M-th timing sequences and said preselected one of the first through the M-th local sequences to produce one of a first addition instruction pulse and a first subtraction instruction pulse at a time;

second means responsive to said local signal for digital processing said first addition instruction pulse and said first subtraction instruction pulse to produce a second addition instruction pulse and a second subtraction instruction pulse; and intermediate means coupled to said first and second means for producing each of said first and said second addition instruction pulses and said first and said second subtraction instruction pulses as said control signal.

3. A destuffing circuit as claimed in claim 2, wherein said first means comprises:

phase comparator means for detecting a phase difference between said predetermined one of the first through the M-th timing sequences and said preselected one of the first through the M-th local sequences to produce a phase difference signal indicating a selected one of first and second conditions at a time;

first up/down counter means coupled to said main local clock generating means and having a first initial value, a first upper threshold value, and a first lower threshold value, said first upper threshold value being higher than said first initial value, said first lower threshold value being lower than said first initial value, said first up/down counter means being responsive to said phase difference signal for counting up and down a first count in synchronism with said main local clock sequence when said phase difference signal indicates said first and said second conditions, respectively, said first up/down counter means producing said first addition instruction pulse whenever said first count increases up to said first upper threshold value, said first up/down counter means producing said first subtraction instruction pulse whenever said first count decreases down to said first lower threshold value; and first initializing means for initializing the first count in said first up/down counter means to said first initial value whenever said first up/down counter means produces one of said first addition instruction pulse and said first subtraction instruction pulse.

4. A destuffing circuit as claimed in claim 2, said local signal comprising local signal pulses, wherein said second means comprises:

second up/down counter means coupled to said first means and having a second initial value, a second upper threshold value, and a second lower threshold value, said second upper threshold value being higher than said second initial value, said second lower threshold value being lower than said second initial value, said second up/down counter means being responsive to said first addition instruction pulse and said first subtraction instruction pulse for counting up and down a second count in synchronism with said first addition instruction pulse and said first subtraction instruction pulse, respectively, said second up/down counter means producing a first renewal pulse whenever said second count increases up to said second upper threshold value, said second up/down counter means producing a second renewal pulse whenever said second count decreases down to said second lower threshold value;

second initializing means for initializing the second count in said second up/down counter means to said second initial value whenever said second up/down counter means produces one of said first and said second renewal pulses;

third up/down counter means coupled to said second up/down counter means and responsive to said first and said second renewal pulses for counting up and down a third count in synchronism with said first and said second renewal pulses, respectively, said third count having an absolute value represented by an absolute value signal, said third count selectively taking positive and negative signs which are produced as positive and negative sign signals, respectively;

multiplier means responsive to said local signal and said absolute value signal for counting the pulses of said local signal to produce a distributed pulse signal in which pulses, equal in number to said absolute value, are equally distributed each time while the pulses of said local signal are counted to a preselected number; and sign judging means responsive to said distributed pulse signal and said sign signal for judging the sign represented by said sign signal, said sign judging means producing each of said distributed pulse signal as said second addition instruction pulse when said sign signal indicates said positive sign, said sign judging means producing each of said distributed pulse signal as said second subtraction instruction pulse when said sign signal indicates said negative sign.

5. A destuffing circuit as claimed in claim 2, wherein said intermediate means comprises:
- first combining means responsive to said first and said second addition instruction pulses for combining said first addition instruction pulse with said second addition instruction pulse to produce a combined addition instruction pulse;
- second combining means responsive to said first and said second subtraction instruction pulses for combining said first subtraction instruction pulse with said second subtraction instruction pulse to produce a combined subtraction instruction pulse; and
- means for supplying said combined addition instruction pulse and said combined subtraction instruction pulse to said phase controlling means as said control signal.

6. A destuffing circuit as claimed in claim 2, said divider means being for further producing a timing pulse sequence and a reset pulse sequence, wherein said intermediate means comprises:
- first temporary memory means responsive to said first addition instruction pulse for temporarily memorizing said first addition instruction pulse as a first stored addition instruction pulse and responsive to said reset pulse sequence for erasing said first stored addition instruction pulse in synchronism with said reset pulse sequence when said first stored addition instruction pulse is present;
- second temporary memory means responsive to said first subtraction instruction pulse for temporarily memorizing said first subtraction instruction pulse as a first stored subtraction instruction pulse and responsive to said reset pulse sequence for erasing said first stored subtraction instruction pulse in synchronism with said reset pulse sequence when said first stored subtraction instruction pulse is present;
- third temporary memory means responsive to said second addition instruction pulse for temporarily memorizing said second addition instruction pulse as a second stored addition instruction pulse and responsive to said reset pulse sequence for erasing said second stored addition instruction pulse in synchronism with said reset pulse sequence when said second stored addition instruction pulse is present;
- fourth temporary memory means responsive to said second subtraction instruction pulse for temporarily memorizing said second subtraction instruction pulse as a second stored subtraction instruction pulse and responsive to said reset pulse sequence for erasing said second stored subtraction instruction pulse in synchronism with said reset pulse sequence when said second stored subtraction instruction pulse is present;
- first combining means responsive to said first and said second stored addition instruction pulses for combining said first stored addition instruction pulse with said second stored addition instruction pulse to produce a combined addition instruction pulse;
- second combining means responsive to said first and said second stored subtraction instruction pulses for combining said first stored subtraction instruction pulse with said second stored subtraction instruction pulse to produce a combined subtraction instruction pulse;
- first additional means responsive to said combined addition instruction pulse and said combined subtraction instruction pulse for producing an uncancelled addition instruction pulse only when said combined addition instruction pulse alone is present and, otherwise, producing no pulse;
- second additional means responsive to said combined addition instruction pulse and combined subtraction instruction pulse for producing an uncancelled subtraction instruction pulse only when said combined subtraction instruction pulse alone is present and, otherwise, producing no pulse;
- first timing decision means responsive to said timing pulse sequence and said uncancelled addition instruction pulse for deciding generation timing of said uncancelled addition instruction pulse with reference to said timing pulse sequence, said first timing decision means producing said uncancelled addition instruction pulse as a timed addition instruction pulse in synchronism with said timing pulse sequence when said uncancelled addition instruction pulse is present;
- second timing decision means responsive to said timing pulse sequence and said uncancelled subtraction instruction pulse for deciding generation timing of said uncancelled subtraction instruction pulse with reference to said timing pulse sequence, said second timing decision means producing said uncancelled subtraction instruction pulse as a timed subtraction instruction pulse in synchronism with said timing pulse sequence when said uncancelled subtraction instruction pulse is present; and
- means for supplying said timed addition instruction pulse and said timed subtraction instruction pulse to said phase controlling means as said control signal.

* * * * *